(12) United States Patent
Sasa

(10) Patent No.: US 11,557,704 B2
(45) Date of Patent: Jan. 17, 2023

(54) LIGHT-EMITTING DEVICE HAVING A HIGHER LUMINANCE

(71) Applicant: NICHIA CORPORATION, Anan (JP)

(72) Inventor: Hirokazu Sasa, Anan (JP)

(73) Assignee: NICHIA CORPORATION, Anan (JP)

( * ) Notice: Subject to any disclaimer, the term of this patent is extended or adjusted under 35 U.S.C. 154(b) by 118 days.

(21) Appl. No.: 17/097,732

(22) Filed: Nov. 13, 2020

(65) Prior Publication Data

US 2021/0151646 A1 May 20, 2021

(30) Foreign Application Priority Data

Nov. 19, 2019 (JP) .............................. JP2019-208358

(51) Int. Cl.
*H01L 33/58* (2010.01)
*H01L 33/50* (2010.01)
*H01L 33/00* (2010.01)
*H01L 33/52* (2010.01)

(52) U.S. Cl.
CPC .......... *H01L 33/58* (2013.01); *H01L 33/0095* (2013.01); *H01L 33/505* (2013.01); *H01L 33/52* (2013.01); *H01L 2933/005* (2013.01); *H01L 2933/0058* (2013.01)

(58) Field of Classification Search
CPC ... H01L 33/58; H01L 33/0095; H01L 33/505; H01L 33/52; H01L 2933/005; H01L 2933/0058
See application file for complete search history.

(56) References Cited

U.S. PATENT DOCUMENTS

| 2006/0006408 | A1 | 1/2006 | Suehiro et al. |
| 2010/0149816 | A1 | 6/2010 | Higashi et al. |
| 2010/0264438 | A1 | 10/2010 | Suenaga |
| 2012/0242216 | A1 | 9/2012 | Kotani et al. |
| 2015/0102366 | A1 | 4/2015 | Wada |
| 2016/0104822 | A1* | 4/2016 | Goeoetz ........... B29D 11/00932 156/719 |

(Continued)

FOREIGN PATENT DOCUMENTS

| JP | 2006-041479 A | 2/2006 |
| JP | 2010-141273 A | 6/2010 |

(Continued)

*Primary Examiner* — Jay C Chang
*Assistant Examiner* — Mikka Liu
(74) *Attorney, Agent, or Firm* — Squire Patton Boggs (US) LLP

(57) ABSTRACT

A light-emitting device includes a light-emitting element, a light-transmissive member having an upper surface in a rectangular shape and a lower surface to be bonded to the light-emitting element, and a covering member disposed to cover lateral surfaces of the light-transmissive member and lateral surfaces of the light-emitting element such that the upper surface of the light-transmissive member is exposed. The light-transmissive member includes a main portion that constitutes the upper surface in the rectangular shape and a peripheral portion that is positioned around the main portion and has a smaller thickness than the main portion. In lateral surfaces of the peripheral portion, recesses are formed each of which is positioned at a location of a corresponding one of corners of the rectangular shape, and is depressed toward the main portion.

13 Claims, 6 Drawing Sheets

(56) References Cited

U.S. PATENT DOCUMENTS

| | | | |
|---|---|---|---|
| 2017/0155022 A1 | 6/2017 | Tomonari et al. | |
| 2017/0248281 A1 | 8/2017 | Ozeki | |
| 2018/0090649 A1* | 3/2018 | Nishioka | H01L 33/58 |
| 2019/0154236 A1 | 5/2019 | Ozeki et al. | |
| 2019/0207071 A1* | 7/2019 | Grötsch | H01L 33/60 |

FOREIGN PATENT DOCUMENTS

| | | | |
|---|---|---|---|
| JP | 2010-272847 A | 12/2010 | |
| JP | 2012-199411 A | 10/2012 | |
| JP | 2015-079805 A | 4/2015 | |
| JP | 2017-108091 A | 6/2017 | |
| JP | 2017-157610 A | 9/2017 | |
| JP | 2019-096675 A | 6/2019 | |

* cited by examiner

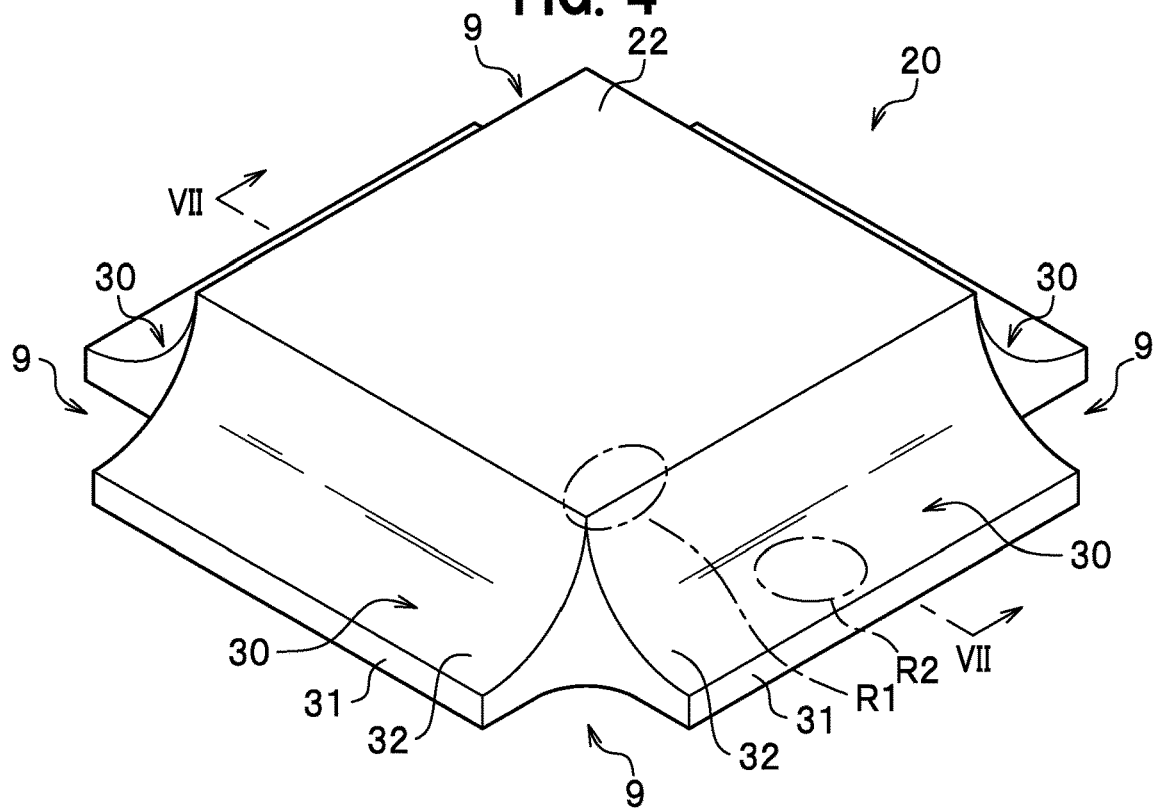
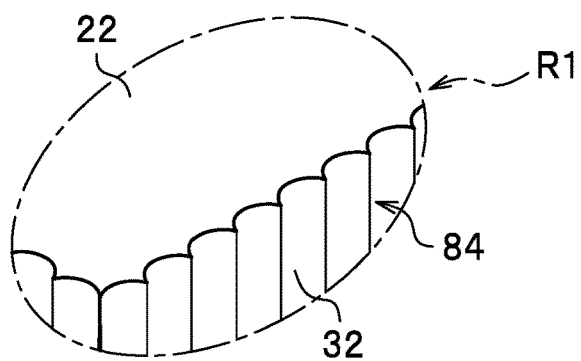
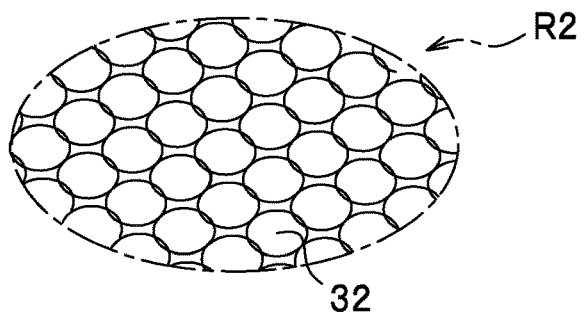

LIGHT-EMITTING DEVICE HAVING A HIGHER LUMINANCE

CROSS-REFERENCE TO RELATED APPLICATION

This application claims priority to Japanese Patent Application No. 2019-208358, filed on Nov. 19, 2019, the disclosure of which is hereby incorporated by reference in its entirety.

BACKGROUND

The present disclosure relates to a light-emitting device and a method of manufacturing a light-emitting device.

A light-emitting device that includes a semiconductor light-emitting element, a phosphor plate having different thicknesses between the central region and outer peripheries, and a light-reflective member have been known (see Japanese Patent Publication No. 2010-272847).

SUMMARY

Light-emitting devices having a higher luminance for use in a light source of vehicles and the like have been awaited.

An object of certain embodiments according to the present disclosure is to provide a light-emitting device having a higher luminance and a method of manufacturing such a light-emitting device.

A light-emitting device according to one embodiment of the present disclosure includes a light-emitting element, a light-transmissive member, and a cover member. The light-transmissive member has an upper surface in a rectangular shape in a top view and a lower surface to be bonded to the light-emitting element. The covering member is disposed to cover lateral surfaces of the light-transmissive member and lateral surfaces of the light-emitting element such that the upper surface of the light-transmissive member is exposed. The light-transmissive member includes a main portion that constitutes the upper surface in the rectangular shape and a peripheral portion that is positioned around the main portion and has a smaller thickness than the main portion. In lateral surfaces of the peripheral portion, recesses are formed each of which is positioned at a location of a corresponding one of corners of the rectangular shape, and is depressed toward the main portion.

A method of manufacturing a light-emitting device according to the embodiment of the present disclosure includes: providing a light-transmissive member including a main portion that constitutes an upper surface in a rectangular shape, a peripheral portion that is positioned around the main portion and has a smaller thickness than the main portion, and, in lateral surfaces of the peripheral portion, recesses are formed each of which is positioned at a location of a corresponding one of corners of the rectangular shape; bonding a lower surface of the light-transmissive member to an upper surface of a light-emitting element; and forming a covering member such that the upper surface of the light-transmissive member is exposed while the recesses of the light-transmissive member and lateral surfaces of the light-emitting element are covered.

Certain embodiments according to the present disclosure can provide a light-emitting device having a higher luminance and a method of manufacturing such a light-emitting device.

BRIEF DESCRIPTION OF THE DRAWINGS

FIG. 4 is a schematic perspective view of a light-transmissive member of the light-emitting device according to the first embodiment.

FIG. 5 is a schematic diagram illustrating a surface of a flange portion at a region R1 of FIG. 4.

FIG. 6 is a schematic diagram illustrating the surface of the flange portion at a region R2 of FIG. 4.

DETAILED DESCRIPTION

Figure 1:
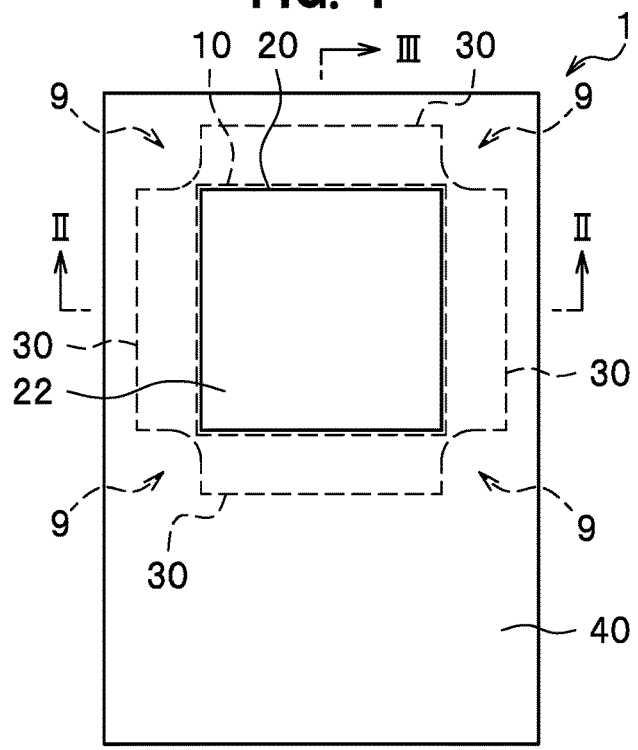
FIG. 1 is a schematic top view of a light-emitting device according to a first embodiment.

Embodiments of the present disclosure are described below with reference to the drawings. The embodiments described below exemplify light-emitting devices and methods of manufacturing light-emitting devices embodying the technical concepts of the present disclosure. However, the invention is not limited to the embodiments described below. Unless specifically stated otherwise, descriptions of the sizes, materials, shapes, and relative positions of constituent components in the embodiments described below are not intended to limit the scope of the present invention to those descriptions, but are rather only examples. Magnitudes or positional relationships of members illustrated in the drawings may be exaggerated in order to clarify the descriptions.

First Embodiment

Figure 2:
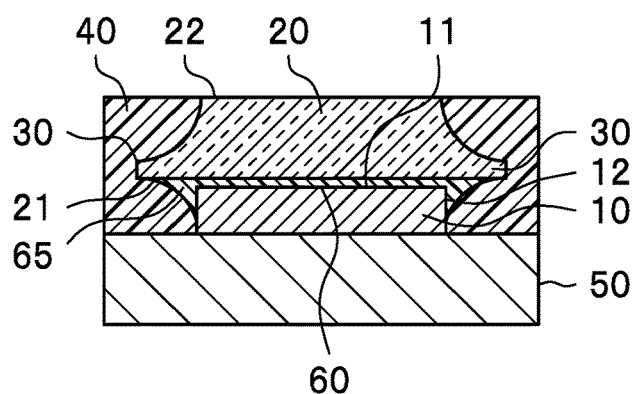
FIG. 2 is a schematic cross-sectional view of the light-emitting device taken along a line II-II of FIG. 1.
Figure 3:
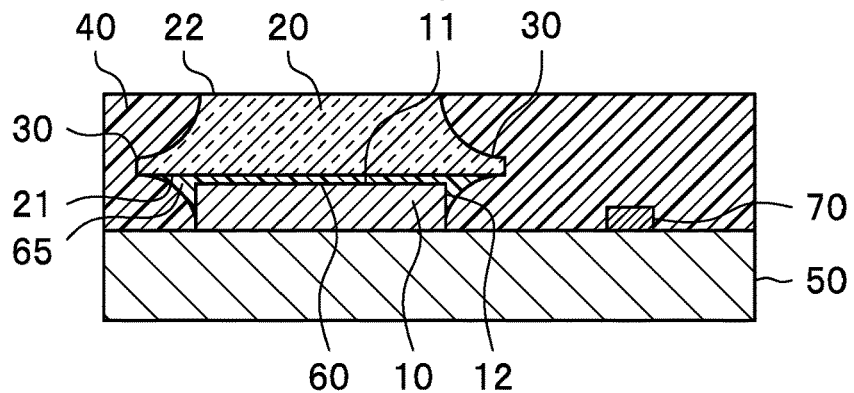
FIG. 3 is a schematic sectional view of the light-emitting device taken along a line of FIG. 1.
Figure 7:
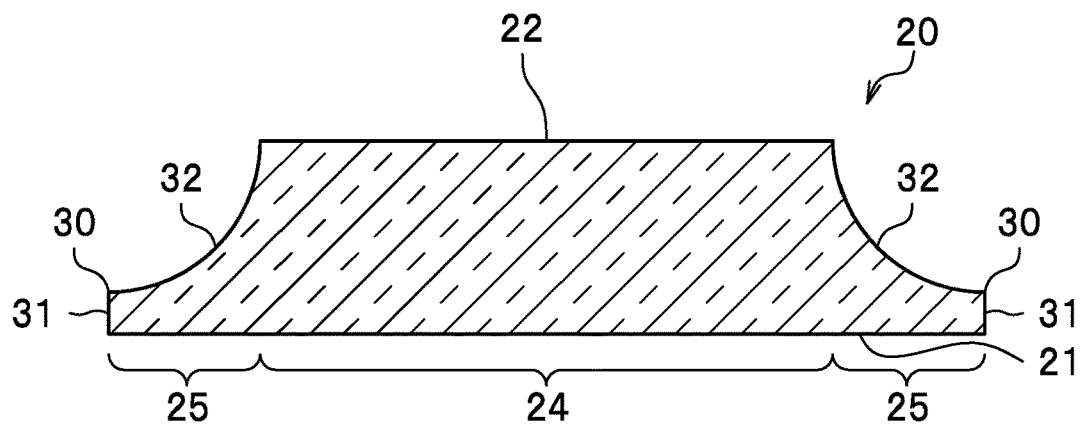
FIG. 7 is a schematic cross-sectional view of the light-transmissive member taken along a line VII-VII of FIG. 4.
Figure 8:
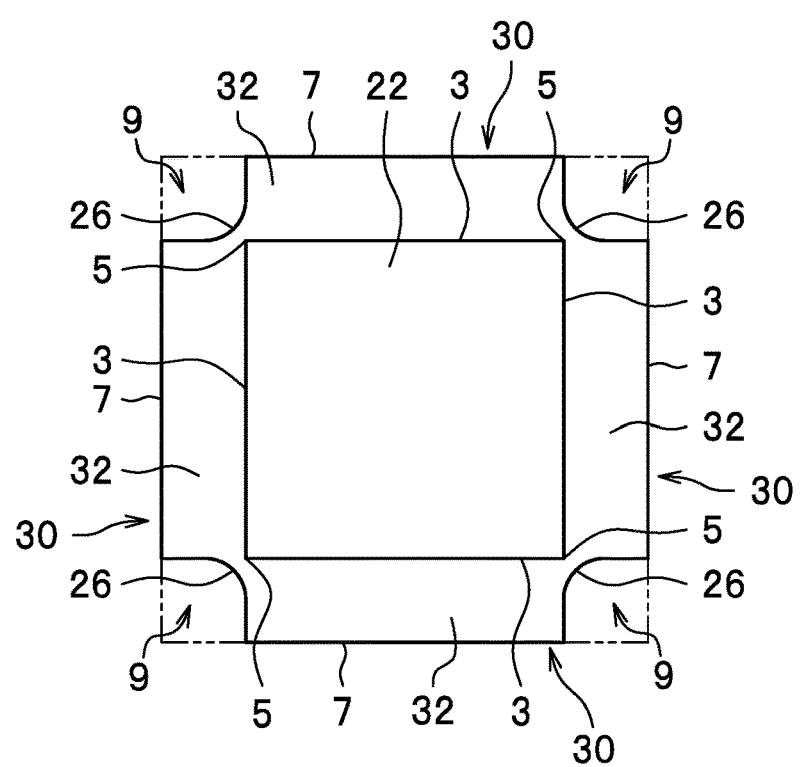
FIG. 8 is a schematic top view of the light-transmissive member of FIG. 4.

FIG. 1 is a schematic top view of a light-emitting device according to a first embodiment. FIG. 2 is a schematic cross-sectional view of the light-emitting device taken along a line II-II of FIG. 1. FIG. 3 is a schematic sectional view of the light-emitting device taken along a line of FIG. 1. FIG. 4 is a schematic perspective view of a light-transmissive member of the light-emitting device according to the first embodiment. FIG. 5 is a schematic diagram illustrating a surface of a flange portion at a region R1 of FIG. 4. FIG. 6 is a schematic diagram illustrating the surface of the flange portion at a region R2 of FIG. 4. FIG. 7 is a schematic cross-sectional view of the light-transmissive member taken along a line VII-VII of FIG. 4. FIG. 8 is a schematic top view of the light-transmissive member of FIG. 4.

Light-Emitting Device

A light-emitting device 1 includes a light-emitting element 10, a light-transmissive member 20 having an upper surface 22 in a rectangular shape and a lower surface 21 to be bonded to the light-emitting element 10, and a covering member 40 disposed to cover lateral surfaces of the light-transmissive member 20 and the light-emitting element 10 such that the upper surface 22 of the light-transmissive member 20 is exposed, as shown in FIGS. 1 to 3. The light-transmissive member 20 includes a main portion 24 that constitutes the upper surface 22 in a rectangular shape and a peripheral portion 25 that is positioned around the main portion 24 and has a smaller thickness than the main portion 24, as shown in FIGS. 4 and 7. The peripheral portion 25 has recesses 9 in lateral surfaces of the peripheral portion 25. Each of the recesses 9 is formed at a location of a corresponding one of corners 5 of the rectangular shape and is depressed toward the main portion 24.

Configurations of the light-emitting device 1 will be described in detail below.

Light-Emitting Element

A light-emitting diode, a laser diode, or the like is preferably used for the light-emitting element 10. A light-emitting element with any appropriate emission wavelength can be selected for the light-emitting element 10. Examples of a blue or green light-emitting element include a light-emitting element including a nitride-based semiconductor ($In_XAl_YGa_{1-X-Y}N$, $0 \leq X$, $0 \leq Y$, $X+Y \leq 1$) or GaP. For a red light-emitting element, a nitride-based semiconductor, GaAlAs, AlInGaP, or the like can be used. A semiconductor light-emitting element made of a material other than the above materials can also be used for the light-emitting element 10. The composition, emission color, size, number, and the like of the light-emitting element 10 can be appropriately selected in accordance with the purpose. The light-emitting element 10 preferably includes positive and negative electrodes on the same surface, which allows for flip-chip mounting on a board 50. In this case, the surface opposite to the surface on which the positive and negative electrodes are disposed serves as the main light-extracting surface of the light-emitting element 10. In the case in which the light-emitting element 10 is face-up mounted on the board 50, the surface on which the positive and negative electrodes are disposed serves as the main light-extracting surface of the light-emitting element 10. The light-emitting element 10 is, for example, electrically connected to the board 50 via bonding members such as bumps. As shown in FIGS. 1 and 3, the light-emitting element 10 and the light-transmissive member 20 can be disposed deviating to one side in the longitudinal direction of the light-emitting device 1 in order to dispose a protective element 70 such as a Zener diode. A light-emitting element including electrodes respectively disposed on the upper surface and on the lower surface can be used for the light-emitting element.

The light-emitting element 10 can have various shapes such as a polygonal shape including a quadrilateral shape and a hexagonal shape, a circular shape, and an elliptic shape, and preferably has a quadrilateral shape, more preferably has a rectangular shape in a top view.

Light-Transmissive Member

The light-transmissive member 20 has a plate-like shape, and includes a main portion that constitutes the upper surface in a rectangular shape and a peripheral portion that is positioned around the main portion and has a smaller thickness than the main portion. The light-transmissive member 20 is provided with the recesses 9 in the peripheral portion 25. Each of the recesses 9 is formed at the location of a corresponding one of the corners of the upper surface in a rectangular shape, and is depressed from the peripheral portion 25 toward the main portion 24. As shown in FIGS. 2 and 3, the light-transmissive member 20 has a protruding shape in a cross-sectional view. The light-transmissive member 20 has the lower surface 21 to be bonded to the upper surface 11 of the light-emitting element 10 and the upper surface 22 encompassed by the lower surface 21 in a top view. The light-transmissive member 20 has the lateral surfaces between the upper surface 22 and the lower surface 21. Each of the lateral surfaces is positioned to correspond to one of the sides of the upper surface 22 in a rectangular shape. Each of the lateral surfaces has an inclined lateral surface 32 that is inclined to expand from the upper surface toward the lower surface, a vertical lateral surface 31 that is continuous to the inclined lateral surface 32 and is perpendicular to the lower surface 21, and a curved lateral surface 26 constituting the recess 9.

Light emitted from the light-emitting element 10 is incident on the lower surface 21 of the light-transmissive member 20. The lower surface 21 of the light-transmissive member 20 is larger in area than the upper surface 11 of the light-emitting element 10. This allows light emitted from the light-emitting element 10 to be incident on the light-transmissive member 20 with less loss of the light. The lower surface 21 of the light-transmissive member 20 is substantially parallel to the upper surface 22, and is substantially flat.

The upper surface 22 of the light-transmissive member 20 serves as the light-emitting surface of the light-emitting device 1, and outputs light incident from the lower surface 21 to the outside. An area of the upper surface 22 is smaller than an area of the lower surface 21. The upper surface 22 of the light-transmissive member 20 is exposed from the covering member 40, and not covered by the covering member 40. The upper surface 22 and the lower surface 21 have substantially similar or analogous shapes in a top view. The upper surface 22 and the lower surface 21 of the light-transmissive member 20 each have a center of gravity preferably overlapping each other. This can reduce unevenness of luminance of the light-emitting surface of the light-emitting device 1 (i.e., the upper surface 22 of the light-transmissive member 20).

As shown in FIGS. 7 and 8, the peripheral portion 25 of the light-transmissive member 20 is formed to have a thickness gradually reducing from the main portion 24 to the outer edge 7. In other words, a height of the light-transmissive member 20 from the lower surface 21 to the upper surface 22 is the smallest at the vertical lateral surface 31 and gradually increases along the inclined lateral surface 32 toward the main portion 24.

The vertical lateral surface 31 of the light-transmissive member 20 is formed substantially perpendicular to the lower surface 21 and the upper surface 22 of the light-transmissive member 20. This can inhibit the covering member 40 from creeping up on the upper surface 22 during manufacturing the light-emitting device 1. The vertical lateral surface 31 is formed, for example, at an angle in a range of 90°±5° with respect to the upper surface 22 to inhibit creeping up of the covering member 40. This range is regarded as "substantially perpendicular" in the present specification.

The inclined lateral surface 32 is formed as an inclined curved surface expanding from the upper surface 22 toward the lower surface 21 of the light-transmissive member 20. The inclined lateral surface 32 is disposed at an angle substantially perpendicular to the upper surface 22 near a boundary between the upper surface 22 and the inclined lateral surface 32. With the inclined lateral surface 32 constituting the inclined curved surface, light from the light-emitting element 10 can be efficiently reflected toward the upper surface 22 of the light-transmissive member 20, so that the high luminance light-emitting device 1 can be obtained. Further, the peripheral portion 25 having a gradually-changing thickness can increase the structural strength of the light-transmissive member 20. Furthermore, with the inclined lateral surface 32 that is disposed at an angle substantially perpendicular to the upper surface 22 near the boundary between the upper surface 22 and the inclined lateral surface 32, in the case in which the upper surface 22 of the light-transmissive member 20 serves as the light-emitting surface of the light-emitting device 1, the boundary between the light-emitting surface of the light-emitting device 1 (i.e., the upper surface 22 of the light-transmissive member 20) and the upper surface of the covering member 40 surrounding the light-emitting surface can be clear.

As shown in FIG. 8, the light-transmissive member 20 has the upper surface in a rectangular shape, and, in the lateral surfaces of the peripheral portion 25, recesses 9 each of which is formed at the location of a corresponding one of the corners of the rectangular shape, and is depressed toward the main portion 24. Each of the recesses 9 has a curved lateral surface 26 in a curved shape in a top view. The curved lateral surface 26 has an arc-like outer shape corresponding to the boundaries between the inclined lateral surface 32 and the vertical lateral surface 31 of the peripheral portion 25 and between the upper surface 22 and the lower surface 21 in a top view.

As shown in FIGS. 4, 7 and 8, the peripheral portion 25 of the light-transmissive member 20 includes flange portions 30 each of which is positioned along a corresponding one of sides 3 of the rectangular shape via the recess 9.

Each of the flange portions 30 protrudes laterally from a corresponding one of the sides of the upper surface 22 of the light-transmissive member 20 in a top view. The flange portion 30 includes four portions corresponding to the four sides of the upper surface 22 in a rectangular shape. The flange portion 30 has a substantially rectangular shape in a top view. The flange portion 30 has a lower surface as the lower surface of the peripheral portion 25 constituting the lower surface 21 of the light-transmissive member 20 together with a lower surface of the main portion 24. The flange portion 30 has the vertical lateral surface 31, the inclined lateral surface 32, and the curved lateral surface 26. Both ends of the vertical lateral surface 31 and the inclined lateral surface 32 are adjacent to the curved lateral surface 26 of the peripheral portion 25.

The light-transmissive member 20 has projections and depressions configuring fine stripe on a surface of the peripheral portion 25 from the upper surface 22 toward the lower surface 21. The projections and depressions configuring the fine stripe can be formed during processing the light-transmissive member 20 using a pulsed laser. The projections and depressions configuring the fine stripe can be formed on at least the inclined lateral surface 32, and can also be formed at the curved lateral surface 26. Similarly, the projections and depressions configuring the fine striped can be formed on a surface of the vertical lateral surface 31 of the light-transmissive member 20.

As shown in an enlarged view of FIG. 5, a boundary region R1 between the inclined lateral surface 32 and the upper surface 22 of the light-transmissive member 20 can have a large number of lines from the upper surface 22 toward the lower surface 21 along the sides of the upper surface 22 in a rectangular shape. That is, in the region R1, the projections and depressions 84 configuring fine stripe are formed on the inclined lateral surface 32 along the sides of the rectangular shape constituting the upper surface 22 of the light-transmissive member 20. The projections and depressions 84 configuring the fine stripe can be formed using laser processing in which a laser spot is linearly moved while pulsed laser is emitted from laser equipment to a material for the light-transmissive member 20. The laser spot is moved to form grooves with a diameter according to the beam diameter of the laser, and the grooves overlap each other. Accordingly, periods of the projections and depressions 84 are smaller than the beam diameter.

The inclined lateral surface 32 includes a region R2 near the vertical lateral surface 31 as shown in an enlarged view of FIG. 6. The region R2 has traces of laser processing. In the region R2, particularly, recognizable streaky traces are formed in the direction along the sides of the rectangular shape constituting the upper surface 22. The traces of laser processing are emphasized in FIGS. 5 and 6 for description. The projections and depressions configuring the stripe on the surface of the peripheral portion 25 of the light-transmissive member 20 can realize enhanced bonding between the covering member 40 described below and the peripheral portion 25 of the light-transmissive member 20 in the light-emitting device 1.

In the light-emitting device 1, as shown in FIG. 1, the recesses 9 are formed in the flange portions of the light-transmissive member 20 so as not to include the corners located far from the center of the light-emitting element 10. If the corners located far from the center of the light-emitting element 10 is included in the flange portions of the light-transmissive member 20, light incident from the lower surface 21 of the light-transmissive member 20 is repetitively reflected near the corner and is attenuated. This may reduce light to be extracted to the outside. On the contrary, the light-emitting device 1 in which the recesses 9 are defined on the light-transmissive member 20 can effectively utilize light that might not be extracted to the outside due to optical attenuation by repetitive reflection. This allows more amount of light incident from the lower surface 21 of the light-transmissive member 20 to be guided to the upper surface 22, so that the high luminance light-emitting device 1 can be obtained.

The light-transmissive member 20 is made of a material that can transmit light from the light-emitting element 10 to be extracted to the outside. The light-transmissive member 20 is formed of, for example, resins, glass, and inorganic materials. The light-transmissive member 20 can contain a diffuser and a phosphor that can convert the wavelength of at least a portion of light incident from the light-emitting element 10. Examples of the light-transmissive member 20 containing phosphors include a sintered body of phosphors and a mixture of phosphor powder and other materials such as resins, glass, ceramics, and other inorganic substances. A compact made of resins, glass, ceramics, and the like provided with a layer containing phosphors on its surface can be used for the light-transmissive member 20. The sintered body of a phosphor can be formed of sintered phosphors only, or can be formed of a sintered mixture of phosphors and sintering agents. In the case of sintering the mixture of the phosphors and sintering agents, inorganic materials such as silicon oxide, aluminum oxide, or titanium oxide are preferably used for the sintering agents. This allows for reducing discoloration and deformation of the sintering agents due to light or heat even in the case of a high-power light-emitting element 10.

For the phosphor, an appropriate phosphor used in the art can be selected. Examples of phosphors that can be excited by a blue or ultraviolet light-emitting element include cerium-activated yttrium-aluminum-garnet phosphors (YAG:Ce) and the like. A light-emitting device configured to emit light having various colors (for example, the light-emitting device that emits white light) can be obtained by combining such phosphors and blue or ultraviolet light-emitting elements. For the light-emitting device 1 that emits white light, types and concentrations of the phosphors contained in the light-transmissive member 20 are adjusted such that white light is obtained. The concentration of the phosphor in the light-transmissive member 20 is, for example, in a range of approximately 30 mass % to approximately 80 mass %.

Covering Member

The covering member 40 can be formed of members capable of reflecting light from the light-emitting element 10. The light emitted from the light-emitting element 10 is directly incident on the light-transmissive member 20, or the light passes through the light-transmissive member 20 after being reflected by the covering member 40, and exits to the outside from the upper surface 22 of the light-transmissive member 20 serving as the light-emitting surface of the light-emitting device 1.

The upper surface of the covering member 40 is preferably located at the same height as or at a position lower than the upper surface 22 of the light-transmissive member 20. The light emitted from the upper surface 22 of the light-transmissive member 20 serving as the light-emitting surface of the light-emitting device 1 spreads also in a lateral direction. If the upper surface of the covering member 40 is located at a position higher than the upper surface 22 of the light-transmissive member 20, the light emitted from the upper surface 22 of the light-transmissive member 20 is reflected by the upper surface of the covering member 40. This may cause unevenness in the light distribution. Hence, the upper surface of the covering member 40 that is located at substantially the same height as or at the position lower than the upper surface 22 of the light-transmissive member 20 is preferable because the light emitted from the light-emitting element 10 can be efficiently extracted to outside the light-emitting device 1.

For the covering member 40, a base material containing a light-reflective substance, and formed of a silicone resin, a modified silicone resin, an epoxy resin, a modified epoxy resin, an acrylic resin, or a hybrid resin containing at least one of these resins can be used. Titanium oxide, silicon oxide, zirconium oxide, yttrium oxide, yttria-stabilized zirconia, potassium titanate, alumina, aluminum nitride, boron nitride, mullite, or the like can be used for the light-reflective substance. The amounts of reflection and transmission of light in the covering member 40 vary according to the concentration and density of the light-reflective substance, and accordingly, the concentration and density can be appropriately adjusted in accordance with the shape and size of the light-emitting device 1. Using a light-reflective and heat-dissipating material for the covering member 40 can improve heat dissipation performance in addition to the light reflectivity. Examples of such materials include aluminum nitride and boron nitride, which have high thermal conductivity.

Board

The light-emitting element 10 is mounted on the board 50, and the board 50 electrically connects the light-emitting device 1 to an external device. The board 50 includes a flat plate-shaped supporting member and conductor wirings disposed on a surface of and/or inside the flat plate-shaped supporting member. The shape, size, and other structural factors of the conductor wiring of the board 50 are selected in accordance with the constitution and size of the electrodes of the light-emitting element 10. An insulating material that hardly transmits light emitted from the light-emitting element 10 and external light is preferably used for the supporting member of the board 50. A material having a certain strength is preferably used for the board 50. Specific examples of the material include ceramics such as alumina, aluminum nitride, and mullite and resins such as phenolic resins, epoxy resins, polyimide resins, bismaleimide-triazine resins (BT resins), and polyphthalamide (PPA). The supporting member can be provided with a cavity. With this structure, the above covering member 40 can be easily formed by dropping the material. The conductor wirings and a heat radiation terminal can be formed of, for example, a metal such as Cu, Ag, Au, Al, Pt, Ti, W, Pd, Fe, and Ni or an alloy of these metals. The conductor wiring can be formed by electroplating, electroless plating, vapor deposition, sputtering, or the like.

Adhesive member

An adhesive member 60 is a material to bond the light-emitting element 10 and the light-transmissive member 20. The adhesive member 60 continuously extends from the upper surface 11 of the light-emitting element 10 to at least a portion of the lateral surfaces 12 of the light-emitting element 10, and is disposed between the covering member 40 and the lateral surfaces 12. The portion of the upper surface of the adhesive member 60 positioned between the covering member 40 and the lateral surfaces 12 of the light-emitting element 10 is in contact with the lower surface 21 of the light-transmissive member 20. A light-transmissive material that can guide light emitted from the light-emitting element 10 to the light-transmissive member 20 is preferably used for the adhesive member 60. Examples of the adhesive member 60 can include known adhesive members such as epoxy resins and silicone resins, organic adhesive members, inorganic adhesive members, and adhesive members employing low-melting-point glass, with high refractive indices. The adhesive member 60 preferably extends from the upper surface 11 to the lateral surfaces 12 of the light-emitting element 10 and forms fillets 65. It is preferable that the fillet 65 be in contact with both the lower surface 21 of the light-transmissive member 20 and the lateral surface 12 of the light-emitting element 10 and have a curved surface being concave toward the covering member 40. This can allow light emitted from the light-emitting element 10 to be reflected at the fillets formed of the adhesive member 60 and to be easily guided to the light-transmissive member 20. The light-transmissive member 20 and the light-emitting element 10 can be directly bonded together by, for example, crimping, sintering, surface-activated bonding, atomic diffusion bonding, and hydroxyl bonding, without using the adhesive member 60.

The light-emitting device 1 has the structure described above. In an example in which the light-emitting device 1 is used for headlights of vehicle such as a motorcycle, an automobile, and the like, or lighting for a ship and the like, light emitted from the light-emitting element 10 can be irradiated to farther location. That is, in the light-emitting device 1, a portion of light emitted from the light-emitting element 10 propagates through the light-transmissive member 20 and travels directly to the upper surface 22 of the light-transmissive member 20 without being reflected by the covering member 40, while another portion of light emitted from the light-emitting element 10 is reflected by the covering member 40 and then exits from the upper surface 22 of the light-transmissive member 20. With the light-emitting device 1 in which the recesses 9 are formed on the light-transmissive member 20, the light incident from the lower surface 21 of the light-transmissive member 20 can be easily guided to the upper surface 22. Further, with the light-transmissive member 20 having a protruding shape, the light emitted from the light-emitting element 10 can be concentrated on the upper surface 22 of the light-transmissive member 20. This can allow the light-emitting device 1 to irradiate light with a high luminance to farther location, which is suitable for a high-beam headlight.

In the light-emitting device 1, the light-transmissive member 20 has the projections and depressions configuring the fine stripe formed from the upper surface 22 toward the lower surface 21 on the surface of the peripheral portion 25. This can increase a contact area between the covering member 40 and the peripheral portion 25 of the light-transmissive member 20, so that adhesion between the covering member 40 and the peripheral portion 25 can be improved.

Method of Manufacturing Light-Emitting Device

Figure 9A:
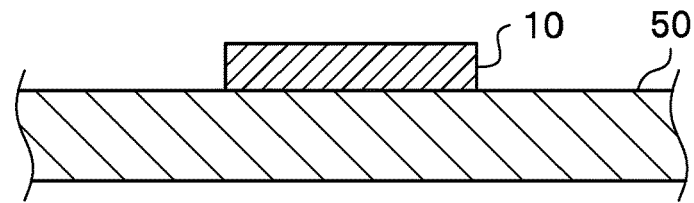
FIG. 9A is a schematic diagram illustrating a light-emitting element mounted on a board in a method of manufacturing the light-emitting device according to the first embodiment.
Figure 9B:
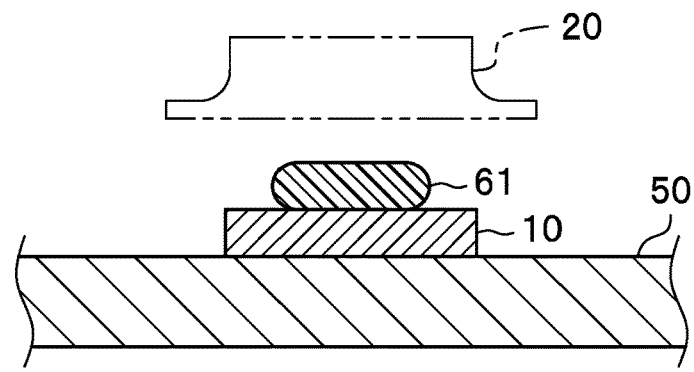
FIG. 9B is a schematic diagram illustrating the light-emitting element on which an adhesive member is applied in the method of manufacturing the light-emitting device according to the first embodiment.
Figure 9C:
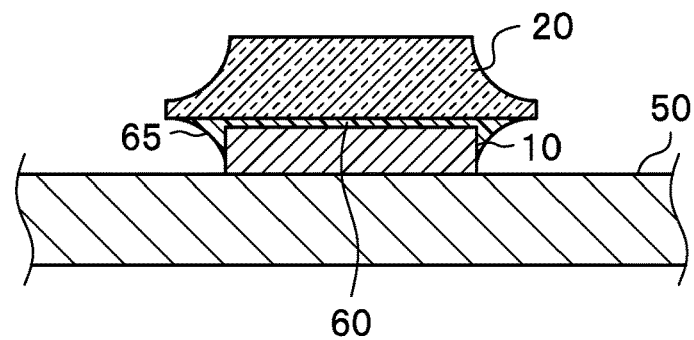
FIG. 9C is a schematic diagram illustrating the light-transmissive member bonded to the light-emitting element via the adhesive member in the method of manufacturing the light-emitting device according to the first embodiment.
Figure 9D:
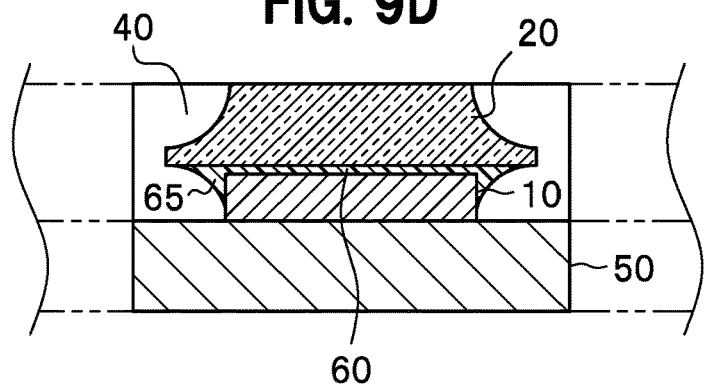
FIG. 9D is a schematic diagram illustrating a covering member disposed on a surfaces of the light-transmissive member except for an upper surface of the light-transmissive member and disposed on the periphery of the light-emitting element in the method of manufacturing the light-emitting device according to the first embodiment.
Figure 10:
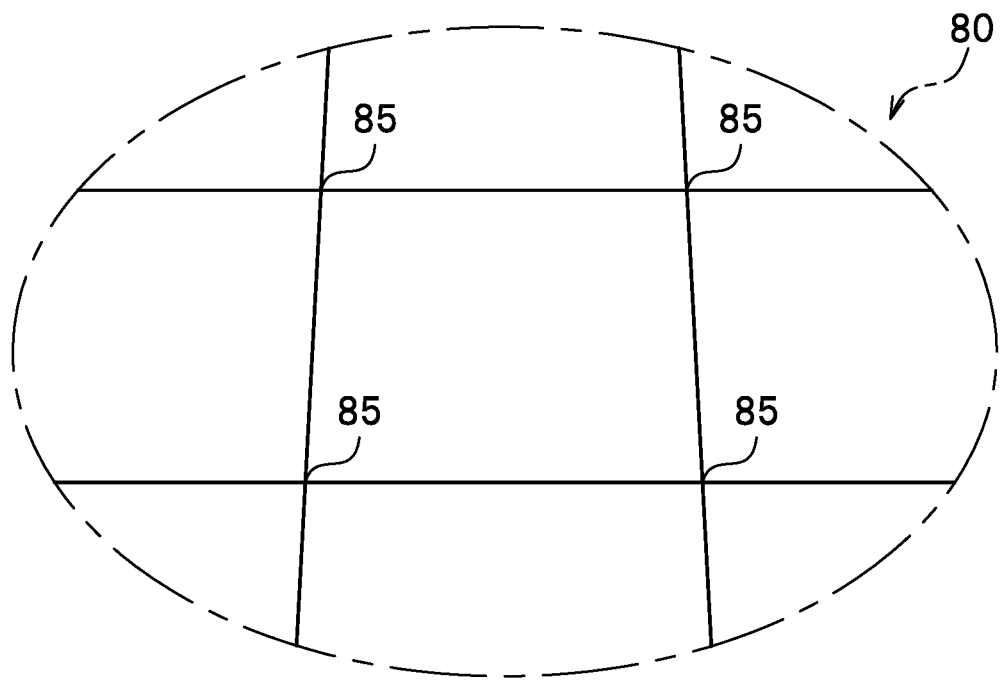
FIG. 10 is a schematic diagram illustrating an example of a light-transmissive board in the method of manufacturing the light-emitting device according to the first embodiment.
Figure 11:
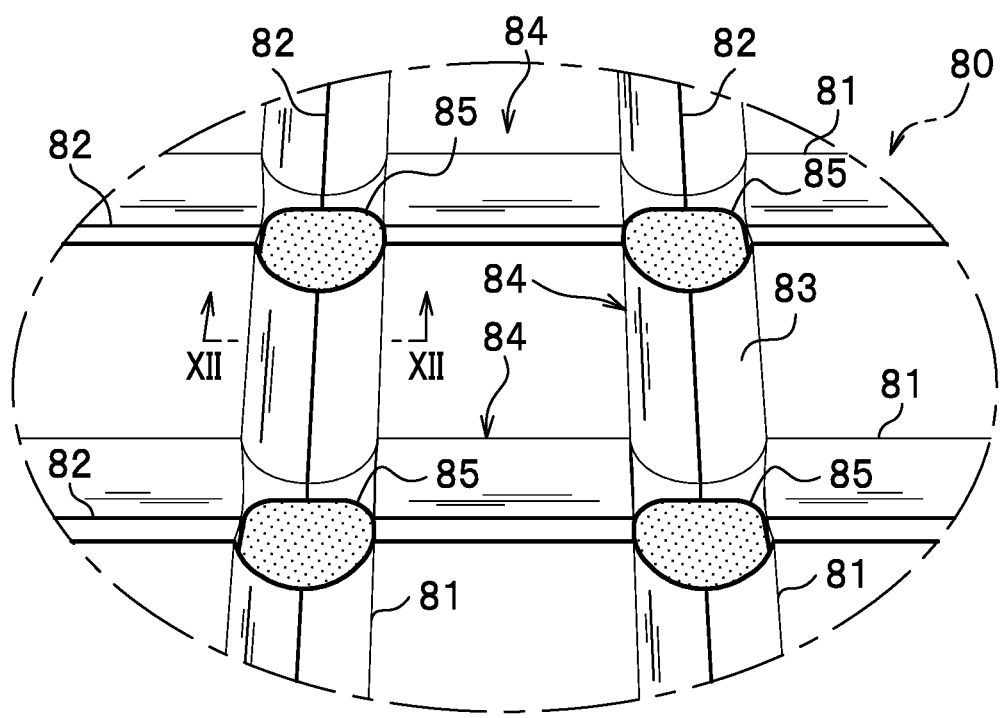
FIG. 11 is a schematic diagram illustrating a step of laser processing in the method of manufacturing the light-emitting device according to the first embodiment.
Figure 12:
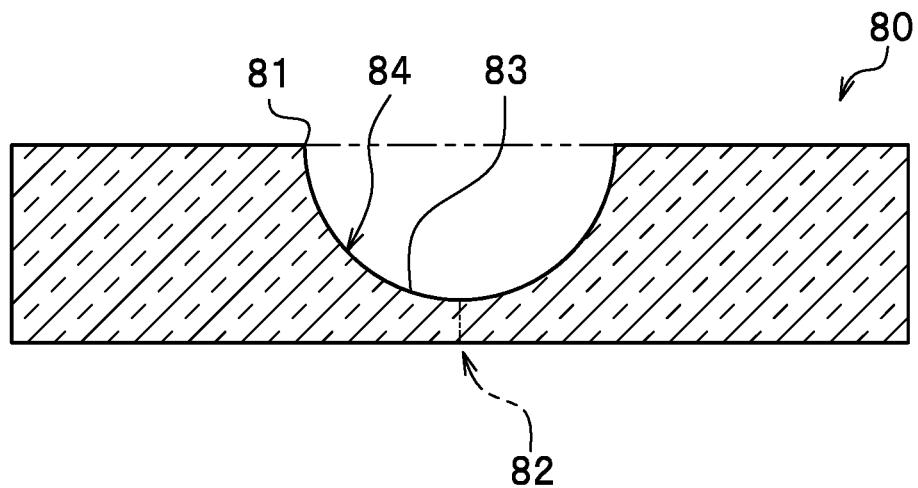
FIG. 12 is a schematic cross-sectional view of the light-transmissive board taken along a line XII-XII of FIG. 11.

An example of a method of manufacturing the light-emitting device will be described. FIG. 9A is a schematic diagram illustrating a light-emitting element mounted on a board in the method of manufacturing the light-emitting device according to the first embodiment. FIG. 9B is a schematic diagram illustrating the light-emitting element on which an adhesive member is applied in the method of manufacturing the light-emitting device according to the first embodiment. FIG. 9C is a schematic diagram illustrating the light-transmissive member bonded to the light-emitting element via the adhesive member in the method of manufacturing the light-emitting device according to the first embodiment. FIG. 9D is a schematic diagram illustrating a covering member disposed on a surface of the light-transmissive member except for an upper surface of the light-transmissive member and disposed so as to surround the periphery of the light-emitting element in the method of manufacturing the light-emitting device according to the first embodiment. FIG. 10 is a schematic diagram illustrating an example of a light-transmissive board in the method of manufacturing the light-emitting device according to the first embodiment. FIG. 11 is a schematic diagram illustrating a step of laser processing in the method of manufacturing the light-emitting device according to the first embodiment. FIG. 12 is a schematic cross-sectional view of the light-transmissive board taken along a line XII-XII of FIG. 11.

The method of manufacturing the light-emitting device includes providing the light-transmissive member 20, bonding the lower surface 21 of the light-transmissive member 20 to the upper surface 11 of the light-emitting element 10, and forming the covering member 40 such that the upper surface 22 of the light-transmissive member 20 is exposed while the recesses 9 of the light-transmissive member 20 and lateral surfaces 12 of the light-emitting element 10 are covered. The light-transmissive member 20 provided in the step of providing the light-transmissive member 20 has the main portion 24 that configures the rectangular upper surface 22 and the peripheral portion 25 that is positioned around the main portion 24 and has a smaller thickness than the main portion 24. In lateral surfaces of the peripheral portion 25, recesses 9 each of which is formed at a location of a corresponding one of corners 5 of the rectangular shape are formed. The step of providing the light-transmissive member 20 will be described below.

Step of Bonding Lower Surface of Light-Transmissive Member to Upper Surface of Light-Emitting Element In the step of bonding the light-transmissive member 20 to the light-emitting element 10, for example, the light-emitting element 10 mounted on the board 50 is provided as shown in FIG. 9A, and an adhesive material 61 is dropped on the upper surface of the light-emitting element 10 as shown in FIG. 9B. The dropped adhesive material 61 is pressed by the light-transmissive member 20, and is wet-spread to the lateral surfaces of the light-emitting element 10, so that an adhesive member 60 having the fillet 65 is formed. The amount and viscosity of the adhesive material 61 to be dropped are appropriately adjusted to such an extent that the fillets are formed on the lateral surfaces of the light-emitting element 10 and that the adhesive material 61 is not wet-spread to the board 50. In the light-transmissive member 20, as shown in FIG. 9C, the lower surface of the light-transmissive member 20 is bonded to the light-emitting element 10 via the adhesive member 60 disposed on the upper surface of the light-emitting element 10.

Step of Forming Covering Member

Subsequently, a step of forming the covering member 40 will be performed. In this step, the covering member 40 is formed to cover the recesses 9 of the light-transmissive member 20 and the lateral surfaces of the light-emitting element 10. The covering member 40 is formed by, for example, potting. The covering member 40 covers gaps between the light-emitting element 10 and the board 50, the light-emitting element 10 and the fillets 65 on the lateral surfaces of the light-emitting element 10, and the recess 9 of the light-transmissive member 20. At this time, a covering material is preferably dropped onto the upper surface of the board 50, apart from the light-transmissive member 20, such that the upper surface 22 of the light-transmissive member 20 is exposed from the covering member 40.

The vertical lateral surface 31 of the light-transmissive member 20 is formed substantially perpendicular to the lower surface 21 and the upper surface 22 of the light-transmissive member 20. This can restrain the unhardened covering member 40, which is dropped on the upper surface of the board 50, from creeping up on the upper surface 22 of the light-transmissive member 20. With the light-transmissive member 20 having the recesses 9, the unhardened resin material constituting the covering member 40, which is dropped on the upper surface of the board 50 by potting, is easily flowed from the recess 9 to the inclined lateral surface 32 of the peripheral portion 25, so that generation of void in the covering member 40 can be reduced.

The covering member 40 can be formed using a molding technique such as compression molding, transfer molding, and injection molding, printing, and the like.

Step of Providing Light-Transmissive Member

Subsequently, the step of providing the light-transmissive member 20 will be described in the case of forming a plurality of light-transmissive members 20 from a single light-transmissive board by laser processing.

As shown in FIGS. 10 and 11, the step of providing the light-transmissive member 20 includes laser processing to form dividing grooves 81 in a lattice pattern on a surface of the light-transmissive board 80 and to penetrate lattice points 85 of the dividing grooves 81. As shown in FIG. 12, the step of providing the light-transmissive member 20 includes dividing the light-transmissive board 80 along a center line 82 of each dividing groove 81 to separate into a plurality of light-transmissive members 20.

The dividing grooves 81 are formed in a lattice pattern on the surface of the plate-like light-transmissive board 80 by laser processing. At the lattice points 85 on which laser processing is overlapped, through holes penetrating the light-transmissive board 80 can be formed. The through holes formed by laser processing have a substantially circular shape in a top view. Subsequently, the light-transmissive board 80 is divided along the center line 82 of each dividing groove 81 to separate into a plurality of light-transmissive members 20. This dividing can provide the light-transmissive members 20 each includes the main portion 24 that constitutes the upper surface in a rectangular shape, the peripheral portion 25 that has a smaller thickness than the main portion 24 in the periphery of the main portion 24, and, recesses 9 each of which is formed at a location of a corresponding one of the corners of the rectangular shape while being positioned at the lateral surfaces of the peripheral portion 25. Each of the recess 9 formed as above has a curved lateral surface 26 in a curved shape in a top view.

In the step of laser processing, the laser spot of a pulsed laser beam is moved in the elongating direction and in the groove-width direction of the dividing grooves 81 to form laser marks 84 on a surface of the dividing grooves 81 of the light-transmissive board 80 along the depth direction of the dividing grooves 81, by using the pulsed laser beam. In the light-transmissive member 20, projections and depressions configuring the stripe is formed by the laser marks 84 on the surfaces of the peripheral portion 25 from the upper surface toward the lower surface.

For the laser processing conditions, any condition that can properly form the dividing grooves 81 on the light-transmissive board 80 can be imposed. Examples of such conditions will be described below. The type of laser is preferably a YAG laser. The oscillation wavelength of the laser is, for example, 355 nm (UV, third harmonic wavelength). The laser beam is a pulsed light and preferably has a pulse width of one femtosecond or more and one nanosecond or less ($10^{-15}$ seconds or more and $10^{-9}$ seconds or less) from the viewpoint of improving processing quality. For example, if the laser beam has a wavelength of 355 nm, the pulse energy of the laser beam is preferably 10 μJ to 80 μJ from the viewpoint of accelerating processing. The beam diameter, which is the width of the laser beam, is preferably approximately 50 μm.

In the case of processing the light-transmissive board 80 under the above laser processing condition, the surface roughness of the inclined lateral surface 32 of the light-transmissive member 20 after laser processing is in the range described below.

The arithmetic mean roughness Ra defined in Japanese Industrial Standard JIS B 0601:2013 of the inclined lateral surface 32 of the light-transmissive member 20 is 1 μm or more and 5 μm or less. The arithmetic mean roughness Ra represents a parameter of linear roughness of the inclined lateral surface 32 of the light-transmissive member 20, which is the processed surface. Ra is obtained by the average of values measured at 16 locations of two-dimensional roughness profile ordinates between appropriate two points.

The surface roughness Sa of the inclined lateral surface 32 of the light-transmissive member 20 is 1 μm or more and 5 μm or less by measuring according to International Standard ISO 25178. The surface roughness Sa represents a parameter of surface roughness of the inclined lateral surface 32 of the light-transmissive member 20, which is the processed surface. Sa is obtained by the average of values measured at 6 locations of three-dimensional roughness profile ordinates within an area.

In the light-emitting device 1 manufactured through the above steps, the light-transmissive member 20 provided with the recesses 9 is bonded to the light-emitting element 10, light that might not be extracted to the outside due to repetitive reflection and optical attenuation can be effectively utilized, so that the luminance can be increased. Further, the projections and depressions 84 configuring the stripe formed on the inclined lateral surface 32 of the light-transmissive member 20 can achieve enhanced bonding between the covering member 40 and the flange portions 30 of the light-transmissive member 20.

Furthermore, because the upper surface 22 of the light-transmissive member 20 has a shape substantially the same as or similar to a shape of the upper surface 11 of the light-emitting element 10, alignment upon bonding the light-transmissive member 20 to the light-emitting element 10 can be facilitated. Particularly, because the light-transmissive member 20 is provided with recesses 9 each of which is formed at a location of a corresponding one of the corners 5 of the rectangular shape in a top view, precision of alignment can be increased.

While the light-emitting device and the method of manufacturing the light-emitting device according to certain embodiments of the present invention have been described above, the scope of the present invention is not limited to the descriptions above and should be broadly understood on the basis of the claims. The scope of the present invention also includes various modifications based on these descriptions.

Figure 13:
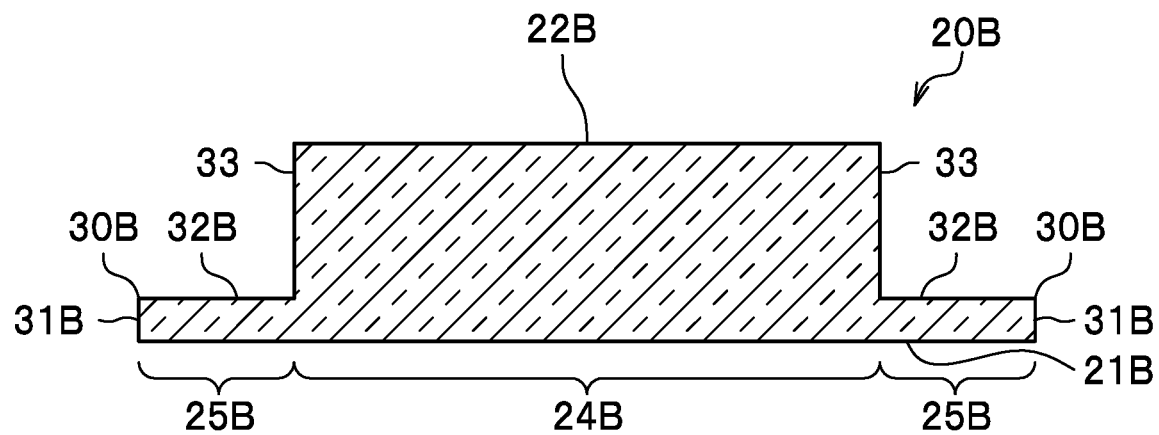
FIG. 13 is a schematic cross-sectional view of a light-transmissive member of a light-emitting device according to a modification.

For example, the light-emitting device includes the light-transmissive member 20 having a cross-sectional shape shown in FIG. 7. However, the light-emitting device can include a light-transmissive member 20B having a cross-sectional shape shown in FIG. 13. The light-transmissive member 20B has a protruding shape in a cross-sectional view. The light-transmissive member 20B has a lower surface 21B to be bonded to the upper surface 11 of the light-emitting element 10, and an upper surface 22B smaller in area than the lower surface 21B. The light-transmissive member 20B includes a main portion 24B that constitutes the upper surface 22B in a rectangular shape and a peripheral portion 25B that is positioned around the main portion 24B and has a smaller thickness than the main portion 24B. The peripheral portion 25B has recesses in the lateral surfaces of the peripheral portion 25B. Each of the recesses is formed at a location of a corresponding one of the corners of the upper surface 22B in a rectangular shape and is depressed toward the main portion 24B. The peripheral portion 25B of the light-transmissive member 20B has a plurality of flange portions 30B defined by the recesses.

Each of the flange portions 30B is formed to have substantially the same thickness from the main portion 24B to the outer edge. The flange portion 30B has an upper surface 32B at a location facing a corresponding each one of the sides of the upper surface 22B in the rectangular shape, first vertical lateral surfaces 31B, second vertical lateral surfaces 33, a lower surface 21B at a location on the peripheral portion 25B, and lateral surfaces respectively corresponding to the corners of the peripheral portion 25B in the rectangular shape. The first vertical lateral surfaces 31B are continuous to the lower surface 21B of the light-transmissive member 20B, and are substantially perpendicular to the lower surface 21B and the upper surface 22B. The upper surface 32B is continuous to the first vertical lateral surfaces 31B, and is substantially perpendicular to the first vertical lateral surfaces 31B. The second vertical lateral surfaces 33 are continuous to the upper surface 32B, and are substantially perpendicular to the upper surface 32B. The second vertical lateral surfaces 33 are also continuous to the upper surface 22B of the light-transmissive member 20B, and are substantially perpendicular to the upper surface 22B. The flange portion 30B can be formed by laser processing such that the dividing groove 81 have substantially the same depth in the width direction. The structure in the modification may have an effect of improving the luminance.

In the light-emitting device 1, the lower surface 21 of the light-transmissive member 20 is bonded to a single light-emitting element 10. However, the lower surface 21 of the light-transmissive member 20 can be bonded to a plurality of light-emitting elements 10. In the light-emitting device according to the modification, for example, two light-emitting elements 10 are arranged to form a rectangular shape as a whole in a top view. In this case, in the step of providing the light-transmissive member, the light-transmissive member having the upper surface in a rectangular shape to cover the upper surfaces of the two light-emitting elements 10 is provided. The structure in the modification may have an effect of improving the luminance.

What is claimed is:

1. A light-emitting device comprising:
   a light-emitting element;
   a light-transmissive member having an upper surface in a rectangular shape, when viewed in a top view, and a lower surface configured to be bonded to the light-emitting element; and
   a covering member disposed to cover lateral surfaces of the light-transmissive member and lateral surfaces of the light-emitting element such that the upper surface of the light-transmissive member is exposed,
   wherein the light-transmissive member comprises:
      a main portion that constitutes the upper surface in the rectangular shape; and
      a peripheral portion that is positioned around the main portion and has a smaller thickness than a thickness of the main portion, the peripheral portion including:
         a plurality of lateral surfaces in which a plurality of recesses are respectively formed at a location corresponding to each corner of the rectangular shape of the upper surface, and each of the plurality of recesses is recessed into the light-transmissive member towards the main portion, and
         a plurality of grooves formed in each lateral surface of the plurality of lateral surfaces of the peripheral portion extending from a respective edge defining the rectangular shape of the upper surface toward the lower surface.

2. The light-emitting device according to claim 1, wherein the peripheral portion of the light-transmissive member includes a flange portion that is defined by the recess and formed along a corresponding one of sides of the rectangular shape.

3. The light-emitting device according to claim 2, wherein the flange portion of the light-transmissive member has a substantially rectangular shape in a top view.

4. The light-emitting device according to claim 1, wherein the light-transmissive member contains a phosphor.

5. The light-emitting device according to claim 1, wherein the peripheral portion of the light-transmissive member is formed to have a thickness that gradually reduces from the main portion towards an outer edge of the peripheral portion.

6. The light-emitting device according to claim 1, wherein each of the plurality of recesses of the light-transmissive member has a curved lateral surface in a curved shape in a top view.

7. The light-emitting device according to claim 1, further comprising at least one additional light-emitting element,
   wherein the lower surface of the light-transmissive member is bonded to the light-emitting element and the additional light emitting element.

8. A method of manufacturing a light-emitting device, the method comprising steps of:
   providing a light-transmissive member including (i) a main portion that constitutes an upper surface in a rectangular shape when viewed in a top view, (ii) a peripheral portion that is positioned around the main portion and has a smaller thickness than a thickness of the main portion, (iii) a plurality of lateral surfaces of the peripheral portion including a plurality of recesses respectively formed at a location corresponding to each corner of the rectangular shape of the main portion, each of the plurality of recesses being recessed into the light-transmissive member towards the main portion, and (iv) a plurality of grooves formed in each lateral surface of the plurality of lateral surfaces of the peripheral portion extending from a respective edge defining the rectangular shape of the main portion toward a lower surface of the light-transmissive member;
   bonding the lower surface of the light-transmissive member to an upper surface of a light-emitting element; and
   forming a covering member such that the upper surface of the light-transmissive member is exposed while the plurality of recesses of the light-transmissive member and lateral surfaces of the light-emitting element are covered.

9. The method of manufacturing a light-emitting device according to claim 8, wherein the step of providing the light-transmissive member includes steps of:
   laser processing to form dividing grooves in a lattice pattern on a surface of a light-transmissive board and to penetrate lattice points of the dividing grooves; and
   dividing the light-transmissive board along a center line of each of the dividing grooves to separate into a plurality of light-transmissive members, and
   wherein in the step of laser processing, a laser spot of a pulsed laser beam is moved in an elongating direction and in a groove-width direction of the dividing grooves to form laser marks on a surface of the dividing grooves of the light-transmissive board along a depth direction of the dividing grooves by using the pulsed laser beam.

10. The method of manufacturing a light-emitting device according to claim 8, wherein the light-transmissive member contains a phosphor.

11. The method of manufacturing a light-emitting device according to claim 8, wherein in the step of providing the light-transmissive member, the upper surface of the light-transmissive member has a shape substantially the same as or similar to a shape of the upper surface of the light-emitting element.

12. The method of manufacturing a light-emitting device according to claim 8, wherein the lower surface of the light-transmissive member is bonded to the light-emitting element and at least one additional light-emitting element.

13. The method of manufacturing a light-emitting device according to claim 8, wherein the step of forming the covering member is performed by potting.

\* \* \* \* \*